(12) United States Patent
Tanaka et al.

(10) Patent No.: US 10,566,316 B2
(45) Date of Patent: Feb. 18, 2020

(54) SEMICONDUCTOR DEVICE AND POWER CONVERSION APPARATUS

(71) Applicant: Mitsubishi Electric Corporation, Chiyoda-ku (JP)

(72) Inventors: Yo Tanaka, Chiyoda-ku (JP); Shinnosuke Soda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/465,649

(22) PCT Filed: Jan. 16, 2018

(86) PCT No.: PCT/JP2018/000957
§ 371 (c)(1),
(2) Date: May 31, 2019

(87) PCT Pub. No.: WO2018/135465
PCT Pub. Date: Jul. 26, 2018

(65) Prior Publication Data
US 2019/0326262 A1 Oct. 24, 2019

(30) Foreign Application Priority Data
Jan. 17, 2017 (JP) ................................. 2017-005898

(51) Int. Cl.
*H01L 25/00* (2006.01)
*H01L 25/07* (2006.01)
(Continued)

(52) U.S. Cl.
CPC .......... *H01L 25/072* (2013.01); *H01L 23/053* (2013.01); *H01L 23/49811* (2013.01);
(Continued)

(58) Field of Classification Search
CPC ..... H01L 25/072; H01L 23/053; H01L 24/33; H01L 23/49822; H02M 7/53871; H02M 7/003
See application file for complete search history.

(56) References Cited

U.S. PATENT DOCUMENTS

2017/0352629 A1* 12/2017 Fukumoto ............... H01L 23/48

FOREIGN PATENT DOCUMENTS

| JP | 8-125115 A | 5/1996 |
|----|------------|--------|
| JP | 2010-287726 A | 12/2010 |
| JP | 2015-41716 A | 3/2015 |

OTHER PUBLICATIONS

International Search Report dated Apr. 3, 2018 in PCT/JP2018/000957 filed on Jan. 16, 2018.

* cited by examiner

*Primary Examiner* — Adolf D Berhane
*Assistant Examiner* — Afework S Demisse
(74) *Attorney, Agent, or Firm* — Oblon, McClelland, Maier & Neustadt, L.L.P.

(57) ABSTRACT

Provided are a semiconductor device which is provided with a circuit board and capable of suppressing an increase in its footprint, and a power conversion apparatus including the semiconductor device. The semiconductor device includes a circuit board, a power semiconductor element, an insulating block, a control signal terminal, a first main terminal, and a second main terminal. The insulating block is disposed so as to surround the power semiconductor element. The control signal terminal is inserted into the insulating block and thereby fixed to the insulating block. The control signal terminal includes a bent portion which partially protrudes above the power semiconductor element from the insulating block, and is bonded to the power semiconductor element. The first main terminal is bonded to the same power semi- (Continued)

conductor element as the power semiconductor element to which the control signal terminal is bonded. The second main terminal is bonded to the circuit board.

5 Claims, 3 Drawing Sheets

(51) Int. Cl.
*H01L 23/498* (2006.01)
*H01L 23/053* (2006.01)
*H02M 7/00* (2006.01)
*H02M 7/5387* (2007.01)
*H01L 23/00* (2006.01)
*H02P 27/08* (2006.01)

(52) U.S. Cl.
CPC ........ *H01L 23/49822* (2013.01); *H01L 24/33* (2013.01); *H02M 7/003* (2013.01); *H02M 7/53871* (2013.01); *H01L 2224/33* (2013.01); *H02P 27/08* (2013.01)

SEMICONDUCTOR DEVICE AND POWER CONVERSION APPARATUS

TECHNICAL FIELD

The present invention relates to a semiconductor device and a power conversion apparatus, and in particular to a semiconductor device such as a power module and a power conversion apparatus including the same.

BACKGROUND ART

Conventionally, in a semiconductor device, and particularly in a power module dealing with a large current, a wiring member such as a bonding wire is used in signal wiring so as to control the operation of power semiconductor elements included the power module. In other words, a control signal pad of a power semiconductor element and a control signal terminal for electrically connecting the power module to the outside are connected to each other by a wiring member such as a bonding wire.

In a power module to be used in a mechanically vibrating environment such as a transportation equipment or the like, the bonding wire for connecting the control signal pad and the control signal terminal may be disconnected due to vibration and thermal fatigue, which makes it impossible to control the power module.

Generally in a power module, the control signal terminal is arranged around the power semiconductor element, and the control signal terminal is connected to the control signal pad by wire bonding or the like. Thus, it is necessary to secure a space for disposing the control signal terminal and a space for moving a bonding tool during the wire bonding. Therefore, a power module using a bonding wire may become large in size due to an increase in its footprint.

In order to deal with such a problem, Japanese Patent Laying-open No. 2010-287726 (PTL 1), for example, discloses a structure in which a control signal terminal fixed inside an insulating block is bonded to a control signal pad of a power semiconductor element via a solder. With such a structure, it is possible to suppress the breakdown of the control signal pad and the control signal terminal due to thermal fatigue. Further, since the control signal terminal extends along the thickness direction crossing the main surface of the power semiconductor element, bonding the control signal terminal in such a manner makes it possible to suppress an increase in the footprint of the semiconductor device.

However, in the semiconductor device disclosed in Japanese Patent Laying-open No. 2010-287726, the semiconductor chip is soldered to the base lead, and the positional relationship between the circuit board to be disposed below the base lead and the control signal pad or the like is inaccurate. In this regard, Japanese Patent Laying-open No. 2015-41716 (PTL 2) and Japanese Patent Laying-open No. 8-125115 (PTL 3), for example, disclose a power semiconductor device such as a power module in which the circuit board and the control signal terminal or the like are accurately arranged.

CITATION LIST

Patent Literature

PTL 1: Japanese Patent Laying-open No. 2010-287726
PTL 2: Japanese Patent Laying-open No. 2015-41716
PTL 3: Japanese Patent Laying-open No. 8-125115

SUMARY OF INVENTION

Technical Problem

However, in either Japanese Patent Laying-open No. 2015-41716 or Japanese Patent Laying-open No. 8-125115, the control signal terminal is not directly bonded to the power semiconductor element. In other words, in the above publications, the control signal terminal and the circuit board are electrically connected to each other at a location outside the power semiconductor element in plan view. Thus, compared with the case where for example the control signal terminal is bonded to the power semiconductor element so as to overlap with the same, the footprint is slightly larger.

The present invention has been made in view of the above problems, and its object is to provide a semiconductor device which is provided with a circuit board and capable of suppressing an increase in its footprint, and a power conversion apparatus including the semiconductor device.

Solution to Problem

The semiconductor device according to the present invention includes a circuit board, a power semiconductor element, an insulating block, a control signal terminal, a first main terminal, and a second main terminal. The power semiconductor element is bonded to one main surface of the circuit board. The insulating block is disposed so as to surround the power semiconductor element, and is formed with an opening directly above the power semiconductor element. The control signal terminal is inserted into the insulating block and thereby fixed to the insulating block. The control signal terminal includes a bent portion which partially protrudes above the power semiconductor element from the insulating block, and is bonded to the power semiconductor element. The first main terminal is bonded to the same power semiconductor element as the power semiconductor element to which the control signal terminal is bonded. The second main terminal is bonded to the circuit board.

Advantageous Effects of Invention

According to the present invention, the control signal terminal and the first main terminal are directly bonded to the same power semiconductor element. Thus, compared with the case where for example the control signal terminal is disposed outside the power semiconductor element and is connected to the power semiconductor element via a bonding wire, it is possible to reduce the footprint in plan view, which makes it possible to further downsize the semiconductor device.

DESCRIPTION OF EMBODIMENTS

Hereinafter, embodiments of the present invention will be described with reference to the drawings.

First Embodiment

Figure 1:
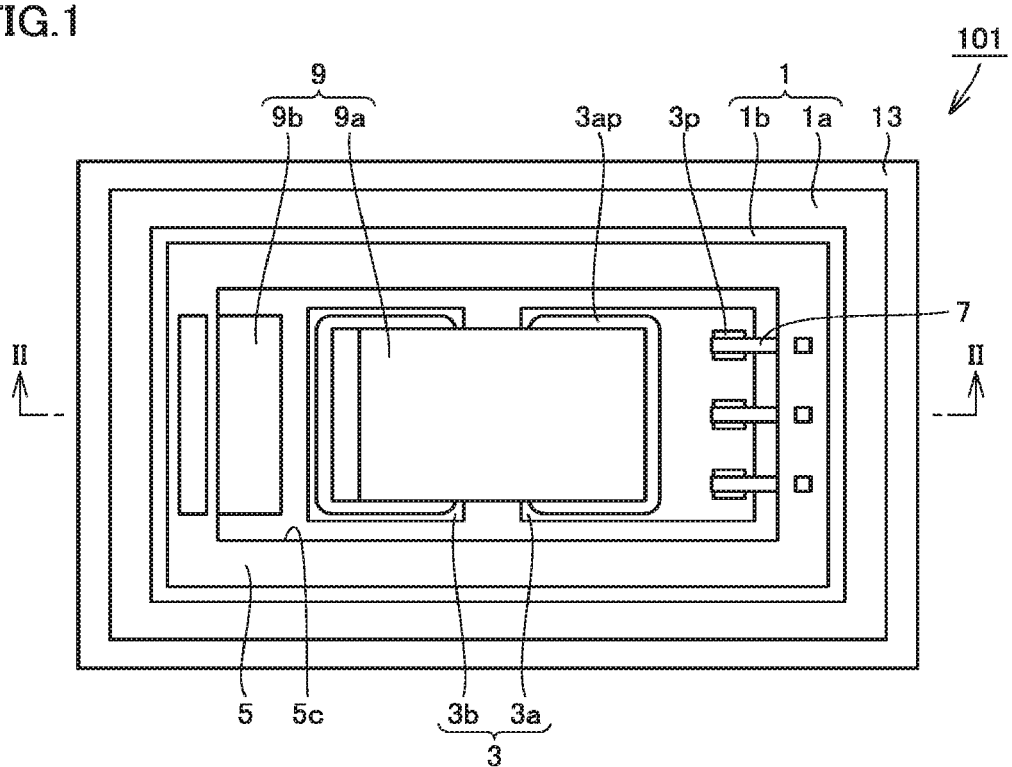
FIG. 1 is a schematic plan view illustrating the configuration of a power module according to a first embodiment.

First, a power module will be described as a semiconductor device of the present embodiment with reference to FIGS. 1 and 2. FIG. 1 is a top view schematically illustrating the configuration of the power module according to the first embodiment, and FIG. 2 is a cross-sectional view schematically illustrating the configuration of the power module according to the first embodiment.

Figure 2:
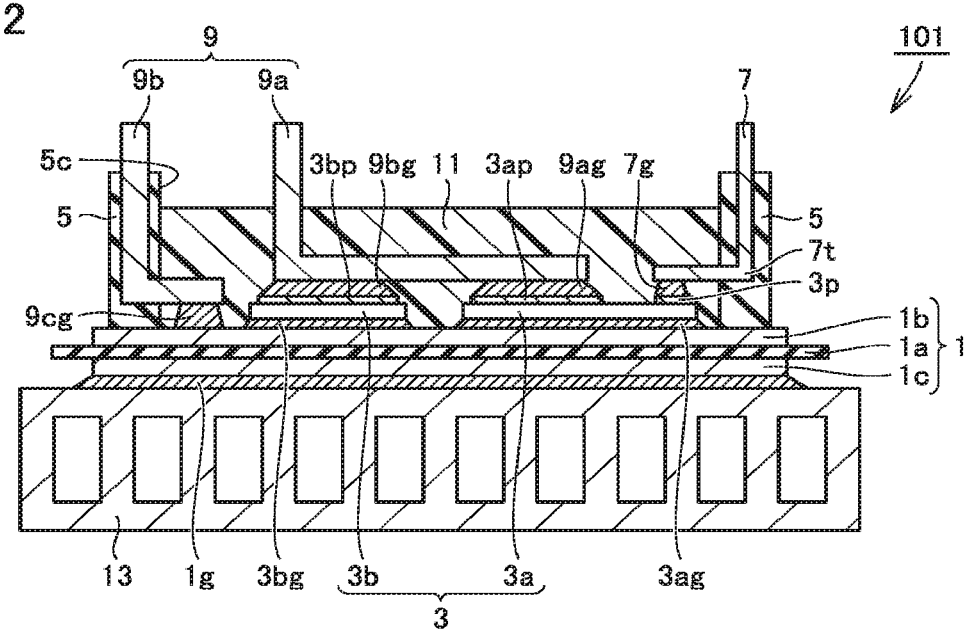
FIG. 2 is a schematic cross-sectional illustrating the configuration of a portion taken along line II-II in FIG. 1.

With reference to FIGS. 1 and 2, a power module 101 serving as the semiconductor device of the present embodiment includes a circuit board 1, a power semiconductor element 3, an insulating block 5, a control signal terminal 7, and a main terminal 9.

The circuit board 1 is a tabular member serving as a base for the entire power module 101. The circuit board 1 includes an insulating member 1a, a circuit pattern 1b, and a metal layer 1c.

The insulating member 1a, for example, is a tabular substrate made of ceramic material and has a rectangular shape in plan view, for example. The ceramic material is preferably any one selected from the group consisting of, for example, alumina, aluminum nitride and silicon nitride, but it is not limited thereto. The insulating member 1a is not necessarily made of ceramic material, it may be made of, for example, an organic material filled with a ceramic filler. The organic material is preferably any one selected from the group consisting of, for example, epoxy resin, polyimide resin and cyanate resin, and the ceramic filler is preferably any one selected from the group consisting of, for example, alumina, aluminum nitride and boron nitride.

The circuit pattern 1b is formed to cover at least a part of one main surface of the insulating member 1a provided on the upper side (the side facing the power semiconductor element 3) in FIG. 2. It is preferable that the circuit pattern 1b is one or a plurality of rectangular patterns in plan view, for example. The metal layer 1c is formed to cover at least a part of the other main surface of the insulating member 1a provided on the lower side (the side opposite to the power semiconductor element 3) in FIG. 2. It is preferable that the metal layer 1c is one or a plurality of rectangular patterns in plan view, for example.

The circuit pattern 1b and the metal layer 1c are formed of, for example, a thin film of copper, but the material constituting the circuit pattern 1b and the metal layer 1c is not limited to copper. The material constituting the circuit pattern 1b and the metal layer 1c may be any material that can be bonded to the insulating member 1a by a direct bonding method or an active metal bonding method. Specifically, the material for the circuit pattern 1b and the metal layer 1c is preferably a material having high electrical conductivity. In the present specification, the direct bonding method refers to such a method that the insulating member 1a and the circuit pattern 1b or the insulating member 1a and the metal layer 1c are bonded through a direct reaction. In the present specification, the active metal bonding method refers to such a method that the insulating member 1a and the circuit pattern 1b or the insulating member 1a and the metal layer 1c are bonded by using a brazing material to which an active metal such as titanium or zirconium is added.

The power semiconductor element 3, for example, is formed as a rectangular semiconductor chip in plan view. The power semiconductor element 3 is preferably an IGBT (Insulated Gate Bipolar Transistor), a FWD (Free Wheel Diode), a MOSFET (Metal Oxide Semiconductor Field Effect Transistor) or the like. However, the power semiconductor element 3 is not limited to those mentioned above. In FIGS. 1 and 2, the power semiconductor element 3 is formed as two power semiconductor elements 3a and 3b separated with an interval, but the number of the power semiconductor elements is not limited to two. The power semiconductor element 3, in other words, the two power semiconductor elements 3a and 3b are bonded to at least a part of one main surface of the circuit board 1, in other words, the main surface on the upper side (the side facing the power semiconductor element 3) in FIG. 2. Specifically, the power semiconductor element 3a is bonded to a part of the upper main surface of the circuit pattern 1b of the circuit board 1 via an element bonding material 3ag. Similarly, the power semiconductor element 3b is bonded to a part of the upper main surface of the circuit pattern 1b of the circuit board 1 via an element bonding material 3bg.

The element bonding materials 3ag and 3bg are provided between the back surface electrodes (not shown) of the power semiconductor elements 3a, 3b and the circuit pattern 1b so as to bond the back surface electrodes of the power semiconductor elements 3a and 3b to the circuit pattern 1b. The element bonding material 3ag or 3bg is a high temperature solder containing lead and tin, for example. However, the element bonding material 3ag or 3bg is not limited thereto. Specifically, a silver nanoparticle paste or a conductive adhesive agent containing silver particles and epoxy resin may be used as the element bonding material 3ag or 3bg.

One main surface, in other words, the upper main surface of the power semiconductor element 3a is formed with a control signal pad 3p and a main electrode pad 3ap, and one main surface, in other words, the upper main surface of the power semiconductor element 3b is formed with a main electrode pad 3bp. However, the pad provided on the main surface of each of the power semiconductor elements 3a, 3b is not limited to those mentioned above. Both the control signal pad 3p and the main electrode pad 3ap or 3bp may be provided on the surface of each of the power semiconductor elements 3a and 3b, but it is acceptable that only the control signal pad 3p or only the main electrode pad 3ap or 3bp is formed thereon. For example, both the control signal pad 3p and the main electrode pad 3ap are provided on the power semiconductor element 3a in FIG. 2, but only the main electrode pad 3bp is provided on the power semiconductor element 3b in FIG. 2. In the plan view of FIG. 1, three control signal pads 3p are formed with an interval separated therebetween, but the number of the control signal pads 3p is not limited to three.

From the viewpoint of maintaining excellent electrical and mechanical characteristics, it is preferable that the control signal pad 3p and the main electrode pads 3ap and 3bp are made of any metal or an alloy containing two or more metals selected from the group consisting of aluminum, copper, silver, nickel and gold.

The insulating block 5 is disposed so as to surround the power semiconductor element 3 in the plan view of FIG. 1, and is formed into a rectangular shape, for example, so as to surround the power semiconductor element 3. Specifically, the insulating block 5 is formed with an opening 5c directly above the power semiconductor elements 3a and 3b. In other words, the insulating block 5 is disposed around the power semiconductor element 3 in the plan view of FIG. 1 but not directly above the power semiconductor element 3. The insulating block 5 is bonded to a relatively outer region on the upper main surface of the circuit pattern 1b in plan view by an adhesive material not illustrated in FIG. 2, for example. Thus, the upper main surface of the circuit pattern 1b and the rectangular frame of the insulating block 5 form a casing, and the power semiconductor element 3 and the like are housed in the casing. However, the insulating block 5 is not limited to the configuration mentioned above. For example, the insulating block 5 may be bonded to the surface of a cooler 13 to be described later.

It is preferable that the insulating block 5 is made of an insulating material which may be injection molded and has high heat resistance. Specifically, the insulating block 5 is preferably made of any one selected from the group consisting of, for example, polyphenylene sulfide, polybutylene terephthalate, liquid crystal resin, and fluorine-based resin. The insulating block 5 and the circuit pattern 1b constitute the casing for the entire power module 101.

As illustrated in FIG. 2, the control signal terminal 7 is inserted into the insulating block 5. Thereby, the control signal terminal 7 is fixed to the insulating block 5. The control signal terminal 7 includes a portion extending in the horizontal direction, in other words, in the left and right direction in FIG. 2 and a portion extending in the vertical direction, in other words, the up and down direction in FIG. 2. The control signal terminal 7 includes a bent portion 7t at the boundary between the portion extending in the horizontal direction and the portion extending in the vertical direction. The portion of the control signal terminal 7 extending in the horizontal direction from the bent portion 7t partially protrudes from the insulating block 5. From another point of view, the bent portion 7t partially protrudes from the insulating block 5 above the power semiconductor element 3. A portion of the control signal terminal 7 protruding from the insulating block 5 is bonded to the power semiconductor element 3a. Specifically, the control signal terminal 7 is bonded to the control signal pad 3p provided on one main surface of the power semiconductor element 3a via a control terminal bonding material 7g, for example. In other words, the control signal terminal 7 and the control signal pad 3p are bonded together via a bonding material, i.e., the control terminal bonding material 7g. In addition, the portion of the control signal terminal 7 extending in the vertical direction is partially exposed out of the insulating block 5 from the top end.

In the plan view of FIG. 1, the width of the control signal terminal 7 is narrower than the width of the control signal pad 3p in the vertical direction in FIG. 1, but it is not limited thereto. For example, the width of the control signal terminal 7 may be the same as the width of the control signal pad 3p in the vertical direction in FIG. 1, or the width of the control signal terminal 7 may be wider than the width of the control signal pad 3p. In the plat view of FIG. 1, three control signal terminals 7 are formed with an interval separated therebetween, but the number of the control signal terminals 7 is not limited to three.

The main terminal 9 includes a first main terminal 9a and a second main terminal 9b. The first main terminal 9a is bonded to the main electrode pad Sap provided on the upper main surface of the power semiconductor element 3a and the main electrode pad 3bp provided on the upper main surface of the power semiconductor element 3a, 3b via a first main terminal bonding material gag and a second main terminal bonding material 9bg disposed on the lower surface of the first main terminal 9a, respectively. In other words, the first main terminal 9a is bonded to the same power semiconductor element 3a as the power semiconductor element 3a to which the control signal terminal 7 is bonded. Further, the first main terminal 9a is bonded to the power semiconductor element 3b via the second main terminal bonding material 9bg. In other words, the first main terminal 9a is bonded to both the main electrode pad Sap of the power semiconductor element 3a and the main electrode pad 3bp of the power semiconductor element 3b.

Similar to the control signal terminal 7, for example, the first main terminal 9a includes a portion extending in the horizontal direction, in other words, in the left and right direction in FIG. 2 and a portion extending in the vertical direction, in other words, the up and down direction in FIG. 2. The first main terminal 9a includes a bent portion at the boundary between the portion extending in the horizontal direction and the portion extending in the vertical direction. The portion extending in the horizontal direction from the bent portion is bonded to both the main electrode pad Sap of the power semiconductor element 3a and the main electrode pad 3bp of the power semiconductor element 3b. Therefore, the portion extending in the horizontal direction of the first main terminal 9a is longer than that of the second main terminal 9b and the control signal terminal 7. In FIG. 2, the bent portion of the first main terminal 9a is bonded to the power semiconductor element 3b, but it is not limited thereto. For example, the bent portion of the first main terminal 9a may be bonded to the power semiconductor element 3a.

In other words, in two of the power semiconductor elements 3, the power semiconductor element 3a is bonded to both the control signal terminal 7 and the first main terminal 9a, whereas the power semiconductor element 3b is bonded to the first main terminal 9a only.

Meanwhile, the second main terminal 9b is bonded to a part of the upper main surface of the circuit pattern 1b via a third main terminal bonding material 9cg. Similar to the control signal terminal 7, the second main terminal 9b is inserted into the insulating block 5 and thereby fixed to the insulating block 5. The second main terminal 9b includes a portion extending in the horizontal direction, in other words, in the left and right direction in FIG. 2 and a portion extending in the vertical direction, in other words, the up and down direction in FIG. 2. The second main terminal 9b includes a bent portion at the boundary between the portion extending in the horizontal direction and the portion extending in the vertical direction. The portion of the second main terminal 9b extending in the horizontal direction from the bent portion partially protrudes from the insulating block 5. The portion of the control signal terminal 7 protruding from the insulating block 5 is bonded to the circuit pattern 1b via the third main terminal bonding material 9cg. In addition, the portion of the second main terminal 9b extending in the vertical direction is partially exposed out of the insulating block 5 from the top end.

It is preferable that the control signal terminal 7, the first main terminal 9a, and the second main terminal 9b are made of a material having excellent electrical conductivity such as copper, aluminum, or an alloy containing at least one of copper and aluminum. However, the material for the control signal terminal 7, the first main terminal 9a, and the second main terminal 9b is not limited thereto.

In addition, it is preferable that the control terminal bonding material 7g, the first main terminal bonding material 9ag, the second main terminal bonding material 9bg, and the third main terminal bonding material 9cg are a high temperature solder containing lead and tin, for example. However, the control terminal bonding material 7g, the first main terminal bonding material 9ag, the second main terminal bonding material 9bg, and the third main terminal bonding material 9cg are not limited thereto. Specifically, a silver nanoparticle paste or a conductive adhesive agent containing silver particles and epoxy resin may be used as the control terminal bonding material 7g, the first main terminal bonding material 9ag, the second main terminal bonding material 9bg, and the third main terminal bonding material 9cg.

In addition, as illustrated in the plan view of FIG. 1, the first main terminal 9a and the second main terminal 9b each is formed as a tabular wiring member. However, the shape of the first main terminal 9a and the second main terminal 9b may not be tabular.

The first main terminal 9a and the second main terminal 9b may be connected to the power semiconductor elements 3a, 3b or the like via an aluminum alloy wire, for example. In this case, the first main terminal bonding material gag, the second main terminal bonding material 9bg, and the third main terminal bonding material 9cg may not be provided on the main electrode pads 3ap, 3bp and the circuit pattern 1b. In FIGS. 1 and 2, it is configured that the second main terminal 9b is inserted into the insulating block 5 and thereby fixed to the same, but it is not limited thereto.

The circuit pattern 1b, the power semiconductor element 3, the portion of the control signal terminal 7 extending in the horizontal direction, the portion of the first main terminal 9a extending in the horizontal direction, the portion of the second main terminal 9b extending in the horizontal direction and the like are sealed in a sealing resin 11. In other words, the sealing resin 11 is disposed to fill the interior of the casing formed by the insulating block 5 and the circuit pattern 1b. Thus, the portion of the control signal terminal 7 which is inserted into the insulating block 5 and extends in the horizontal direction, the portion of the second main terminal 9b which is inserted into the insulating block 5 and extends in the horizontal direction, and the portion of the first main terminal 9a which extends in the horizontal direction are covered with the sealing resin 11. A part of the portion extending in the vertical direction of the first main terminal 9a, in other words, a region relatively close to the bent portion is also covered with the sealing resin 11.

On the other hand, for example, the other part of the portion extending in the vertical direction of the first main terminal 9a, in other words, the top end distant from the bent portion is exposed out of the sealing resin 11. Similarly, the top end of the portion of the control signal terminal 7 extending in the vertical direction and the top end of the portion of the second main terminal 9b extending in the vertical direction, which are exposed out of the insulating block 5, are exposed out of the sealing resin 11.

The sealing resin 11, for example, is formed of silicone resin, but it is not limited thereto. The sealing resin 11 may be one or more selected from the group consisting of, for example, a urethane resin, an epoxy resin, a polyimide resin, a polyamide resin, a polyamide-imide resin, an acrylic resin, and a rubber material. The sealing resin 11 may be formed by mixing a plurality of resin materials or may be formed by overlaying an epoxy resin on a gel-like silicone resin, for example.

In FIG. 2, the sealing resin 11 is disposed to fill the interior of the casing formed by the insulating block 5 and the circuit pattern 1b, but it is not limited thereto. For example, the sealing resin 11 may be disposed to not only fill the interior of the casing but also cover the exterior of the casing. In this case, it is necessary to provide a case (not shown) or the like for the cooler 13 or the like to be described later and fill the case with the sealing resin 11.

In the power module 101, the cooler 13 is bonded to the lower main surface of the circuit board 1, particularly the metal layer 1c, via a metal layer bonding material 1g. However, when the insulating member 1a is formed of an organic material filled with a ceramic filler and the ceramic filler is any one selected from the group consisting of alumina, aluminum nitride and boron nitride, the metal layer 1c and the metal layer bonding material 1g are unnecessary. In other words, the insulating member 1a may be disposed directly on the cooler 13.

The cooler 13 radiates the heat generated during the operation of the power module 101 to the outside. Therefore, the cooler 13 is preferably made of a material having excellent thermal conductivity. Specifically, the material for the cooler 13 may be, for example, an alloy containing aluminum or copper as the main ingredient, or a composite material of silicon carbide and aluminum (Al—SiC). However, the material for the cooler 13 is not limited to thereto. Although not shown in the drawings, it is preferable that a coolant flow path for promoting heat exchange is formed in the cooler 13.

The metal layer bonding material 1g is preferably a high temperature solder containing lead and tin, for example. However, the metal layer bonding material 1g is not limited thereto. Specifically, for example, a silver nanoparticle paste or a conductive adhesive agent containing silver particles and an epoxy resin may be used as the metal layer bonding material 1g.

Hereinafter, the effects of the present embodiment will be described.

In the present embodiment, the control signal terminal 7 is disposed to partially overlap with the power semiconductor element 3a to which the first main terminal 9a is bonded, and the control signal terminal 7 is directly bonded to the power semiconductor element 3a via the control terminal bonding material 7g. Therefore, compared with the case, for example, where the control signal terminal 7 is disposed outside the power semiconductor element 3a in plan view and the control signal terminal 7 is connected to the power semiconductor element 3a via a bonding wire, it is possible to save the space. Specifically, in the present specification, the space includes a space that is needed to directly bond the control signal terminal 7 to, for example, the circuit board 1 outside the power semiconductor element 3a, and a space that is needed to connect the control signal terminal 7 and the power semiconductor element 3a via wire bonding. Therefore, according to the present embodiment, it is possible to further downsize the power module 101. Further, compared with the case where the control signal terminal 7 and the power semiconductor element 3a are connected via a bonding wire, it is possible to suppress the wire disconnection due to vibration and thermal fatigue.

In the power module 101, the control signal terminal 7 is inserted into the insulating block 5 and thereby fixed to the same. The portion of the control signal terminal 7 that partially protrudes from the insulating block 5 in the horizontal direction, including the bent portion, is bonded to the control signal pad 3p via the control terminal bonding material 7g. Since the control signal terminal 7 includes the portion extending in the horizontal direction, its tip portion may be disposed directly above the control signal pad 3p. As a result, as described above, the control signal terminal 7 and the power semiconductor element 3a are bonded via the control terminal bonding material 7g. Therefore, as described above, compared with the case where the control signal terminal 7 and the power semiconductor element 3a are connected via a bonding wire, it is possible to suppress the wire disconnection due to vibration and thermal fatigue, and it is possible to save the space for wire bonding or the like so as to further downsize the power module.

In addition, the present embodiment also has the following effects. For example, if the insulating block 5 is not formed with the opening 5c, and thereby the power semiconductor element 3 is completely covered by the insulating block 5, it is impossible to observe the junction between the control signal pad 3p and the control signal terminal 7 from the outside of the power module 101. Therefore, it is difficult to evaluate the quality of the junction between the control signal pad 3p and the control signal terminal 7 from the outside by visual observation. In the case where the control signal pad 3p and the control signal terminal 7 are bonded by a bonding material such as solder, they may not be bonded with a sufficient area due to the positional deviation between the control signal pad 3p and the control signal terminal 7, resulting in a defective product. If the bonding quality between the control signal pad 3p and the control signal terminal 7 can not be evaluated from the outside by visual observation, a defective product may be shipped out. In order to prevent a defective product from being shipped out, it is required to check the bonding quality between the control signal pad 3p and the control signal terminal 7 by the nondestructive inspection test or the electrical characteristic test, which increases the manufacturing cost.

Therefore, in the present embodiment, the insulating block 5 is disposed so as to surround the power semiconductor element 3, and the power semiconductor element 3 is not covered by the insulating block 5 but sealed with the sealing resin 11. Therefore, the quality of the junction between the control signal pad 3p and the control signal terminal 7 may be evaluated from the outside by visual observation, compared with the case where the evaluation is made by performing the nondestructive inspection test or the electrical characteristic test, it is possible to prevent the manufacturing cost of the power module 101 from increasing.

Furthermore, the present embodiment also has the following effects. In the power module 101 of the present embodiment, the second main terminal 9b is bonded to the circuit pattern 1b of the circuit board 1 via the third main terminal bonding material 9cg. Therefore, compared with the case where the second main terminal 9b is connected to the circuit board 1 via a bonding wire, it is possible to suppress the wire disconnection due to vibration and thermal fatigue.

Second Embodiment

Figure 3:
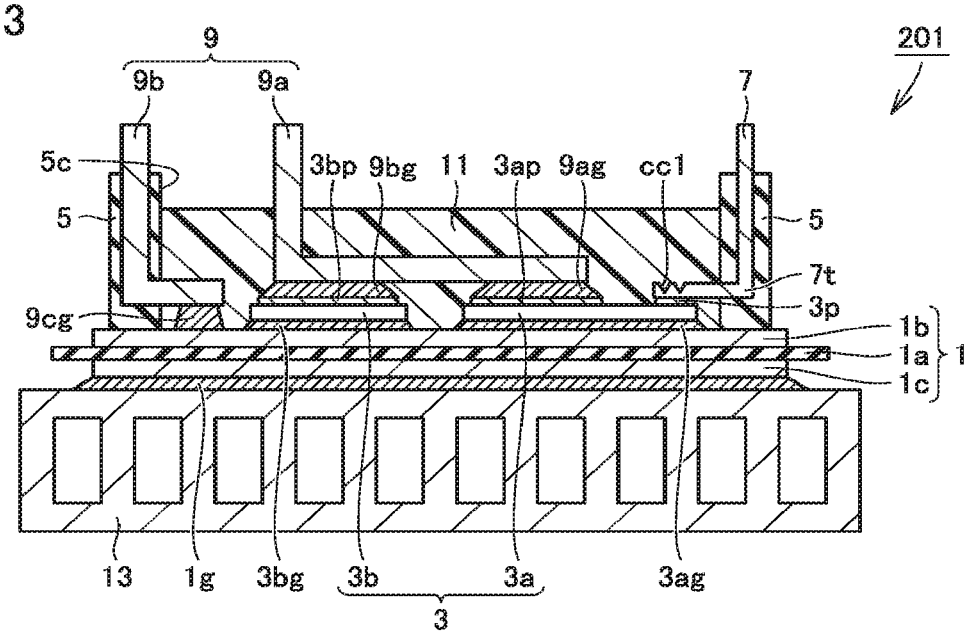
FIG. 3 is a schematic cross-sectional view illustrating the configuration of a power module according to a first example of a second embodiment and corresponding to FIG. 2 of the first embodiment.

FIG. 3 is a cross-sectional view schematically illustrating the configuration of a power module according to a first example of the second embodiment. With reference to FIG. 3, a power module 201 serving as the semiconductor device according to the first example of the present embodiment basically has the same configuration as the power module 101 of the first embodiment, so that the same elements will be denoted by the same reference numerals, and the description thereof will not be repeated. However, the power module 201 according to the present embodiment differs from the power module 101 in that the control signal terminal 7 is directly bonded to the surface of the control signal pad 3p without using the control terminal bonding material 7g. Further, in the power module 201, a recess cc1 is provided on a part of the surface, particularly on a part of the upper surface of a portion of the control signal terminal 7 extending in the horizontal direction and protruding from the insulating block 5.

In the power module 201, the control signal terminal 7 is bonded to the control signal pad 3p by the ultrasonic bonding method. Generally, during the ultrasonic bonding, a bonding tool is used to apply ultrasonic vibration the control signal terminal 7 while pressing the wiring member such as the control signal terminal 7 from the above so as to bond the control signal terminal 7 to the control signal pad 3p. Therefore, at the time of applying the ultrasonic vibration, an indentation is formed by the bonding tool on the upper surface of the horizontal portion of the control signal terminal 7. As a result, the recess cc1 is formed on the upper surface of the control signal terminal 7.

Figure 4:
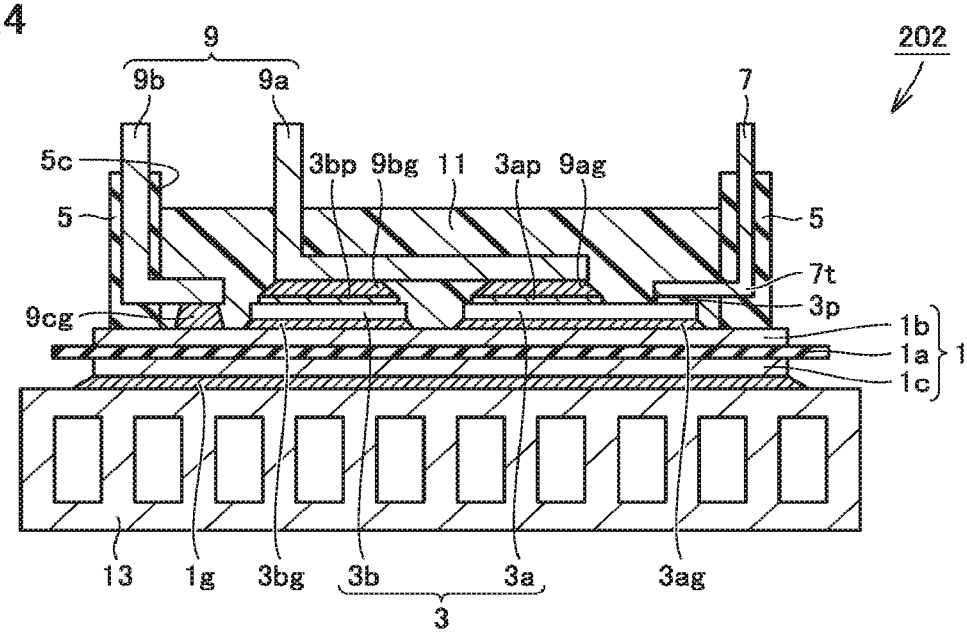
FIG. 4 is a schematic cross-sectional view illustrating the configuration of a power module according to a second example of the second embodiment and corresponding to FIG. 2 of the first embodiment.

As described above, in the power module 201 of FIG. 3, the recess cc1 is formed on the upper surface of the horizontal portion of the control signal terminal 7, but the present invention is not limited thereto. FIG. 4 is a cross-sectional view schematically illustrating the configuration of a power module according to a second example of the second embodiment. With reference to FIG. 4, a power module 202 serving as the semiconductor device according to the first example of the present embodiment basically has the same configuration as the power module 201 except that the power module 202 is not formed with the recess cc1 on the upper surface of the horizontal portion, and thus, the upper surface is a flat surface.

As illustrated in the power module 202 of FIG. 4, if possible, the control signal terminal 7 and the control signal pad 3p may be directly bonded together by the ultrasonic bonding method without the recess cc1 being formed on the upper surface of the horizontal portion of the control signal terminal 7. In this case, it is easy to determine that the control signal terminal 7 and the control signal pad 3p are directly bonded together by the ultrasonic bonding method by visually observing the junction which is exposed by disassembling the sealing resin 11 of a product from the outside, for example.

Hereinafter, the effects of the present embodiment will be described.

In the power module 201 or 202 of the present embodiment, the control signal terminal 7 is directly bonded to the surface of the control signal pad 3p by the ultrasonic bonding method. Therefore, compared with the case where the control signal terminal 7 is bonded to the control signal pad 3p via the control terminal bonding material 7g as in the power module 101 according to the first embodiment, it is possible to increase the strength of the junction between the control signal terminal 7 and the control signal pad 3p, which makes it possible to improve the reliability of the junction between the control signal terminal 7 and the control signal pad 3p.

Third Embodiment

Figure 5:
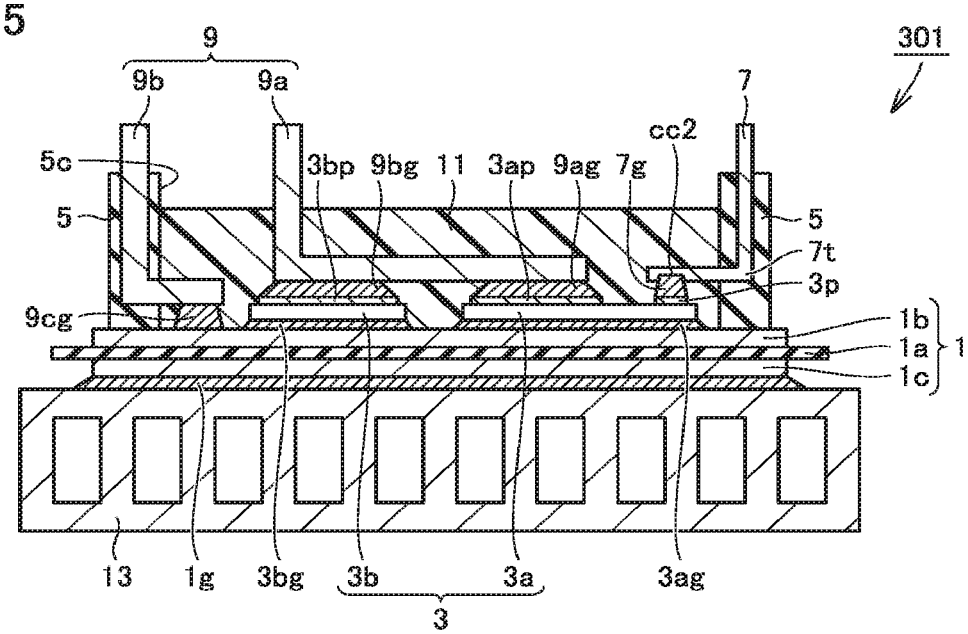
FIG. 5 is a schematic cross-sectional view illustrating the configuration of a power module according to a third embodiment and corresponding to FIG. 2 of the first embodiment.

FIG. 5 is a cross-sectional view schematically illustrating the configuration of a power module according to a third embodiment. With reference to FIG. 5, a power module 301 serving as the semiconductor device of the first example of the present embodiment basically has the same configuration as the power module 101 of the first embodiment, so that the same elements will be denoted by the same reference numerals, and the description thereof will not be repeated. However, in the power module 301 of the present embodiment, a portion of the control signal terminal 7 extending in the horizontal direction and protruding from the insulating block 5 is formed with a recess cc2 on a part of its surface, particularly on a part of the lower surface (the surface facing the circuit board 1). Therefore, the control terminal bonding material 7g may be disposed between the portion of the control signal terminal 7 extending in the horizontal direction and the control signal pad 3p in such a manner that a part of the bonding material is fit in the recess cc2. In other words, in the power module 301, the control terminal bonding material 7g is fit in the recess cc2 in such a manner that a part of the surface of the bonding material contacts the inner wall surface of the recess.

The dimension of the recess cc2 is arbitrarily determined according to the dimension of the control signal terminal 7, the dimension of the control signal pad 3p and the dimension of the control terminal bonding material 7g, and it is preferably about 300 μm in the vertical direction and about 400 μm in the horizontal direction in plan view. In other words, the recess cc2 is preferably about 300 μm or more and about 400 μm or less in the vertical direction and the horizontal direction.

Unlike the recess cc1, the recess cc2 is not formed in the ultrasonic bonding process, it is formed in advance before the step of bonding the control signal terminal 7 and the control signal pad 3p.

Next, the effects of the present embodiment will be described.

In the power module 301 of the present embodiment, the position of the control signal terminal 7 is determined by the recess cc2 and the control terminal bonding material 7g. This is because when the control terminal bonding material 7g is fit in the recess cc2 so that a part of the surface of the bonding material contacts the inner wall surface of the recess, the position of the control terminal bonding material 7g relative to the recess cc2 is determined. Therefore, it is possible to suppress variations in the bonding position between the control signal terminal 7 and the control signal pad 3p.

Fourth Embodiment

The present embodiment relates to a power conversion apparatus equipped with the semiconductor device according to the first to third embodiments described above. Although the present invention is not limited to a specific power conversion apparatus, hereinafter, a three-phase inverter will be described as the present invention according to a fourth embodiment.

Figure 6:
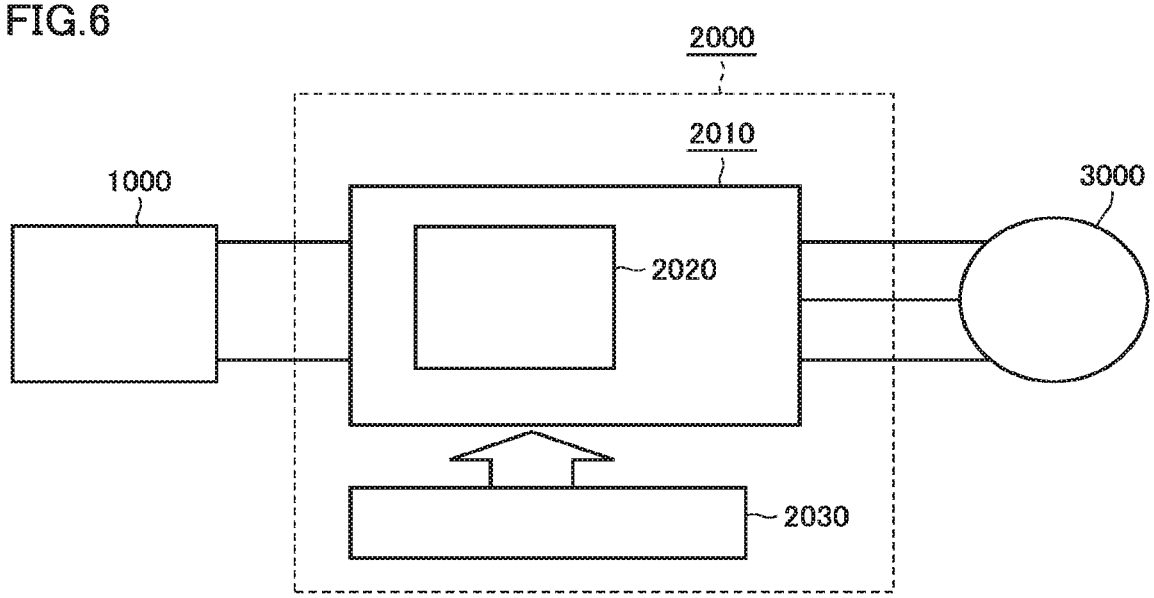
FIG. 6 is a block diagram illustrating the configuration of a power conversion system equipped with a power conversion apparatus according to a fourth embodiment.

FIG. 6 is a block diagram illustrating the configuration of a power conversion system equipped with the power conversion apparatus according to the present embodiment.

The power conversion system illustrated in FIG. 6 includes a power source 1000, a power conversion apparatus 2000, and a load 3000. The power source 1000 is a DC power source configured to supply DC power to the power conversion apparatus 2000. The power source 1000 may be constituted in various manners, for example, it may be constituted by a DC system, a photovoltaic battery and a storage battery, or it may be constituted by a rectifier circuit or an AC/DC converter connected to an AC system. Further, the power source 1000 may be constituted by a DC/DC converter that converts DC power supplied from a DC system to a predetermined power.

The power conversion apparatus 2000 is a three-phase inverter connected between the power source 1000 and the load 3000, and is configured to convert DC power supplied from the power source 1000 to AC power, and supply the AC power to the load 3000. As illustrated in FIG. 6, the power conversion apparatus 2000 includes a main conversion circuit 2010 configured to convert input DC power into AC power and output the AC power, and a control circuit 2030 configured to output a control signal to the main conversion circuit 2010 so as to control the main conversion circuit 2010.

The load 3000 is a three-phase motor driven by the AC power supplied from the power conversion apparatus 2000. It should be noted that the load 3000 is not limited to a specific application, it may be an electric motor mounted on various electric devices such as a hybrid car, an electric car, a railway vehicle, an elevator, or an air conditioner.

Hereinafter, the power conversion apparatus 2000 will be described in detail. The main conversion circuit 2010 includes switching elements and freewheeling diodes (not shown), and is configured to convert DC power supplied from the power source 1000 to AC power and supply the AC power to the load 3000 according to the on and off of the switching elements. Although there are various specific circuit configurations for the main conversion circuit 2010, the main conversion circuit 2010 according to the present embodiment is a two-level three-phase full bridge circuit which may include six switching elements and six freewheeling diodes connected in anti-parallel to the switching elements, respectively. At least one of each switching element and each freewheeling diode of the main conversion circuit 2010 is constituted by a semiconductor module 2020 corresponding to any one of the power modules 101, 201, 202 and 301 of the first to third embodiments described above. Each two of the six switching elements are connected in series to form an upper arm and a lower arm, and each pair of the upper and lower arms constitutes each phase (U phase, V phase, W phase) of the full bridge circuit. The output terminals of the upper and lower arms, in other words, the three output terminals of the main conversion circuit 2010 are connected to the load 3000.

Further, the main conversion circuit 2010 includes a drive circuit (not shown) for driving at least one of each switching element and each freewheeling diode (hereinafter simply referred to as "(each) switching element"). The drive circuit may be built in the semiconductor module 2020 or may be separated from the semiconductor module 2020. The drive circuit generates a drive signal for driving the switching element of the main conversion circuit 2010, and supplies the drive signal to the control electrode of the switching element of the main conversion circuit 2010. Specifically, according to a control signal supplied from the control circuit 2030 to be described later, a driving signal for turning on the switching element or a driving signal for turning off the switching element is output to the control electrode of each switching element. When it is desired to maintain a switching element at the ON state, the driving signal is a voltage signal (ON signal) equal to or higher than the threshold voltage of the switching element, and when it is desired to maintain a switching element at the OFF state, the driving signal is a voltage signal (OFF signal) lower than the threshold voltage of the switching element.

The control circuit 2030 controls the switching element of the main conversion circuit 2010 so as to supply desired power to the load 3000. Specifically, the time (ON time) for maintaining each switching element of the main conversion circuit 2010 at the ON state is calculated based on the amount of power to be supplied to the load 3000. For example, the main conversion circuit 2010 may be controlled by PWM control that modulates the ON time of the switching element according to the output voltage. A control command (control signal) is supplied to the drive circuit of the main conversion circuit 2010 so that an ON signal is output to a switching element to be turned ON or an OFF signal is output to a switching element to be turned OFF at each timing. According to the control signal, the drive circuit outputs an ON signal or an OFF signal as the drive signal to the control electrode of each switching element.

In the power conversion apparatus according to the present embodiment, since the power module according to the first to third embodiments is applied as the switching element and the freewheeling diode of the main conversion circuit 2010, it is possible to downsize the power conversion apparatus and suppress the wire disconnection due to vibration and thermal fatigue.

In the present embodiment, as an example, the present invention is applied to a two-level three-phase inverter. However, the present invention is not limited thereto, and it may be applied to various power conversion apparatuses. In the present embodiment, the power conversion apparatus is a two-level power conversion apparatus, it may be a three-level or multi-level power conversion apparatus. In the case where electric power is supplied to a single-phase load, the present invention may be applied to a single-phase inverter. In the case where electric power is supplied to a DC load or the like, the present invention may be applied to a DC/DC converter or an AC/DC converter.

Further, the power conversion apparatus to which the present invention is applied is not limited to the case where the above-described load is an electric motor, and it may be used as a power source for an electric discharge machine, a laser processing machine, an induction heating cooker or a wireless power supply system, or used as a power conditioner for a photovoltaic power generation system or a power storage system, for example.

The features described in each of the above-described embodiments (examples included in each embodiment) may appropriately combined as long as they are not technically inconsistent to each other.

The embodiments disclosed herein are merely by way of example and not limited thereto. The scope of the present invention is defined by the terms of the claims, rather than the description above, and is intended to include any modifications within the meaning and scope equivalent to the terms of the claims.

REFERENCE SIGNS LIST

1: circuit board; 1a: insulating member; 1b: circuit pattern; 1c: metal layer; 1g: metal layer bonding material; 3, 3a, 3b: power semiconductor element; 3ag, 3bg: element bonding material; 3ap, 3bp: main electrode pad; 3p: control signal pad; 5: insulating block; 5c: opening; 7: control signal terminal; 7g: control terminal bonding material; 7t: bent portion; 9: main terminal; 9a: first main terminal; 9ag: first main terminal bonding material; 9b: second main terminal; 9bg: second main terminal bonding material; 9cg: third main terminal bonding material; 11: sealing resin; 13: cooler; 101, 201, 202, 301: power module; 1000: power source; 2000: power conversion apparatus; 2010: main conversion circuit; 2030: control circuit; 3000: load; cc1, cc2: recess

The invention claimed is:
1. A semiconductor device comprising:
a circuit board;
a power semiconductor element that is bonded to one main surface of the circuit board;
an insulating block that is disposed so as to surround the power semiconductor element and is formed with an opening directly above the power semiconductor element;
a control signal terminal that is inserted into the insulating block and thereby fixed to the insulating block, and includes a bent portion which partially protrudes above the power semiconductor element from the insulating block and is bonded to the power semiconductor element;
a first main terminal that is bonded to the same power semiconductor element as the power semiconductor element to which the control signal terminal is bonded; and
a second main terminal that is bonded to the circuit board.
2. The semiconductor device according to claim 1, wherein
a control signal pad is provided on one main surface of the power semiconductor element, and
the control signal terminal is bonded to the control signal pad via a bonding material.
3. The semiconductor device according to claim 1, wherein
a control signal pad is provided on one main surface of the power semiconductor element, and
the control signal terminal is directly bonded to the surface of the control signal pad.
4. The semiconductor device according to claim 1, wherein
a recess is provided on a part of the surface of the control signal terminal facing the circuit board.
5. A power conversion apparatus comprising:
a main conversion circuit including the semiconductor device according to claim 1 and configured to convert an input electric power and output the converted power; and
a control circuit configured to output a control signal to the main conversion circuit so as to control the main conversion circuit.

* * * * *